United States Patent
Jin et al.

(10) Patent No.: US 7,844,651 B2
(45) Date of Patent: Nov. 30, 2010

(54) EQUALIZER, GROUP DELAY COMPENSATION CIRCUIT FOR THE EQUALIZER AND METHOD OF COMPENSATING FOR GROUP DELAY IN THE EQUALIZER

(75) Inventors: Woo-Kang Jin, Suwon-si (KR); Yun-Cheol Han, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1512 days.

(21) Appl. No.: 11/043,075

(22) Filed: Jan. 27, 2005

(65) Prior Publication Data

US 2005/0174189 A1 Aug. 11, 2005

(30) Foreign Application Priority Data

Feb. 6, 2004 (KR) .................... 10-2004-0007851

(51) Int. Cl.
*G06F 17/10* (2006.01)
*G06F 7/02* (2006.01)

(52) U.S. Cl. ..................... 708/322; 708/819
(58) Field of Classification Search ................ 708/323, 708/819
See application file for complete search history.

(56) References Cited

U.S. PATENT DOCUMENTS 5,235,540 A 8/1993 De Veirman
6,407,875 B1 * 6/2002 Pierson ........................ 360/46
6,472,932 B2 10/2002 Morie et al.
6,522,707 B1 * 2/2003 Brandstetter et al. ........ 375/350

FOREIGN PATENT DOCUMENTS

| JP | 2002-8314 A | 1/2002 |
|---|---|---|
| KR | 1998-0014110 | 6/1998 |
| KR | 1020020003724 | 1/2002 |

OTHER PUBLICATIONS

Korean Office Action dated Aug. 30, 2005.

* cited by examiner

*Primary Examiner*—Chuong D Ngo
(74) *Attorney, Agent, or Firm*—Harness, Dickey & Pierce, P.L.C.

(57) ABSTRACT

An equalizer, group delay compensation circuit for the equalizer and method of compensating for group delay may improve group delay characteristics in the equalizer. The equalizer circuit may include a first low pass filter configured to filter a received input signal to output a filtered input signal, and a gain control circuit connected to an output terminal of the first low pass filter, and configured to modulate a gain of a transfer function for the equalizer. The equalizer may include a group delay compensation circuit connected to the output terminal of the first low pass filter and configured to compensate for a group delay of the input signal, and a second low pass filter connected to the output terminal of the first low pass filter.

16 Claims, 4 Drawing Sheets

EQUALIZER, GROUP DELAY COMPENSATION CIRCUIT FOR THE EQUALIZER AND METHOD OF COMPENSATING FOR GROUP DELAY IN THE EQUALIZER

CLAIM FOR PRIORITY

This application claims priority under 35 U.S.C. §119 to Korean Patent Application No. 2004-7851 filed on Feb. 6, 2004, the contents of which are herein incorporated by reference in its entirety.

BACKGROUND OF THE INVENTION

1. Field of the Invention

The present invention relates to an equalizer and a group delay compensation circuit for the equalizer.

2. Description of the Related Art

A group delay parameter for a filter, which has implications for features of the filter, indicates time delay of a signal passing through the filter. When a sine-wave signal is applied to the filter, a resulting filter output has a sinusoidal form with time delay, thereby causing a phase difference between the input signal and the filter output signal. The group delay $\tau_g$ may be expressed by an equation of $\tau_g = \partial\theta/\partial\omega$, wherein $\theta$ denotes a phase, and $\omega$ represents an angular frequency. That is, the group delay may represent a phase variance relative to a variance of the angular frequency.

The group delay may be disadvantageous in that it may cause a signal distortion. Generally, a modulated input signal has respective sidebands at both ends of a carrier frequency. When the group delay occurs in such an input signal including at least two frequencies, time delays according to respective frequencies may cause different phase delays. Therefore, the input signal provided to the filter may be distorted due to the different phase delays.

FIG. 1 is a circuit diagram illustrating a conventional equalizer circuit. An equalizer circuit may be used to compensate group delay characteristics and to reduce the signal distortion in a broad band of frequencies. Referring to the FIG. 1, the conventional equalizer circuit may include a biquadratic filter 102, a transconductor 104 and a capacitor C3. The transconductor 104 and the capacitor C3 may be connected to the biquadratic filter 102 as shown in FIG. 1.

The biquadratic filter 102 has a transfer function whose numerator and denominator are expressed by a second order function. The transconductor 104 and the capacitor C3 may be additionally installed as part of the biquadratic filter 102 so as to prevent a deterioration of the group delay characteristics due to a parasitic resistance and a parasitic capacitance of the biquadratic filter 102.

The additional capacitor C3 may take up a relatively large area on a semiconductor substrate. In addition, an error in the transfer function generated by the parasitic resistance and capacitance needs to be reduced and/or compensated. The problem may be addressed by matching a transconductance Gm1 of the transconductor 104 with the capacitor C3. However, in matching the transconductance Gm1 and the capacitor C3, manufacturing process margins for the semiconductor may be limited, such that certain electric characteristics of the equalizer circuit may not be guaranteed.

SUMMARY OF THE INVENTION

An exemplary embodiment of the present invention is directed to an equalizer circuit. The equalizer circuit may include a first low pass filter configured to filter a received input signal to output a filtered input signal, and a gain control circuit connected to an output terminal of the first low pass filter, and configured to modulate a gain of a transfer function for the equalizer. The equalizer may include a group delay compensation circuit connected to the output terminal of the first low pass filter and configured to compensate for a group delay of the input signal, and a second low pass filter connected to the output terminal of the first low pass filter.

Another exemplary embodiment of the present invention is directed to group delay compensation circuit of an equalizer. The group delay compensation circuit may be configured to compensate for a group delay of an input signal received thereto, wherein the equalizer includes a gain control circuit configured to modulate a gain of a transfer function for the equalizer and a second low pass filter connected to output terminals of the first low pass filter and gain control circuit, the group delay compensation circuit connected to the output terminal of the first low pass filter, and the group delay compensation circuit is disposed substantially parallel to the gain control circuit in the equalizer.

Another exemplary embodiment of the present invention is directed to a method of compensating for group delay in an equalizer. In the method, filtering a received input signal is filtered to output a filtered input signal. A gain of a transfer function for the equalizer is modulated and a group delay of the input signal is adjusted.

BRIEF DESCRIPTION OF THE DRAWINGS

The present invention will become more apparent by describing, in detail, exemplary embodiments thereof with reference to the attached drawings, wherein like elements are represented by like reference numerals, which are given by way of illustration only and thus do not limit the exemplary embodiments of the present invention.

DETAILED DESCRIPTION OF THE EXEMPLARY EMBODIMENTS

Figure 1:
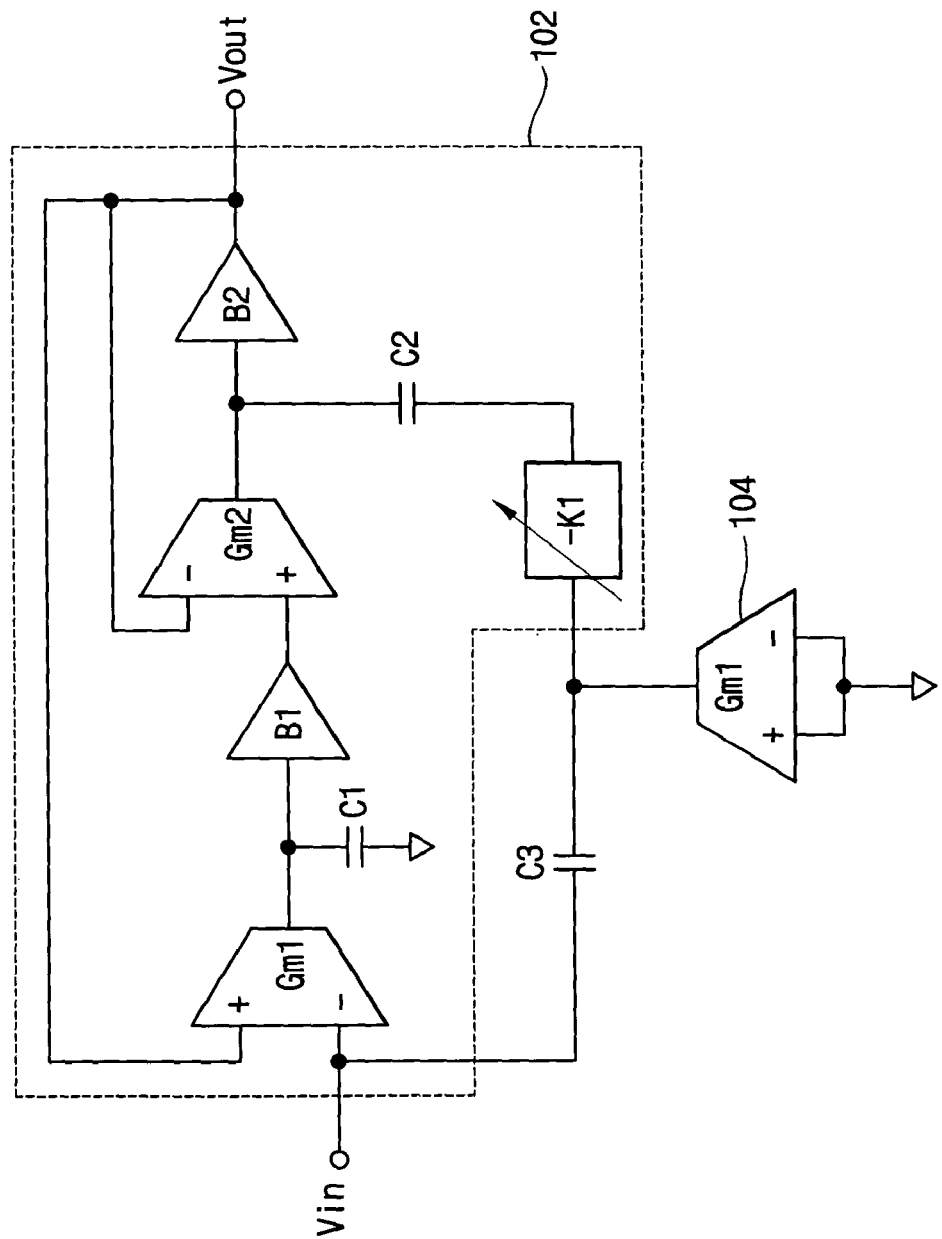
FIG. 1 is a circuit diagram illustrating a conventional equalizing circuit.

The present invention will become more apparent to those of ordinary skill in the art by describing, in detail, exemplary embodiments thereof with reference to the attached drawings, wherein like elements are represented by like reference numerals, which are given by way of illustration only and thus do not limit the exemplary embodiments of the present invention.

Figure 2A:
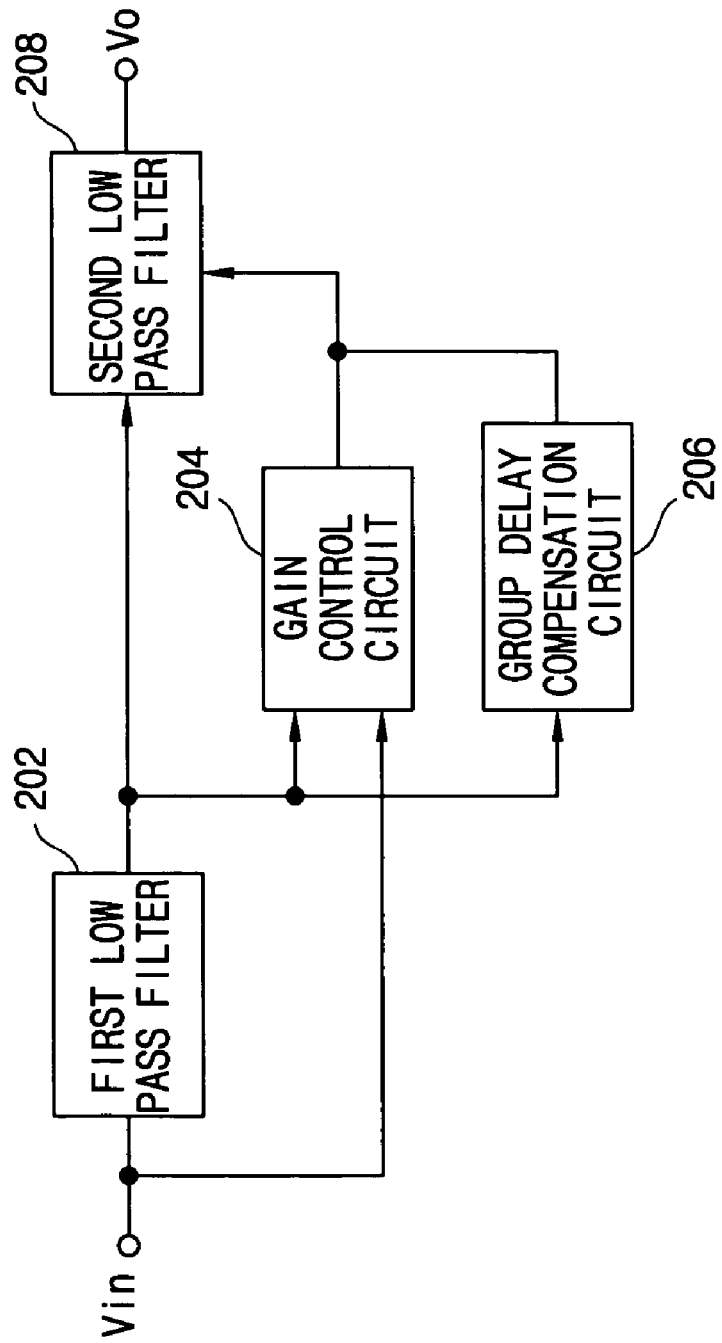
FIG. 2A is a block diagram illustrating an equalizer according to an exemplary embodiment of the present invention.

FIG. 2A is a block diagram illustrating an equalizer according to an exemplary embodiment of the present invention. Referring to FIG. 2A, the equalizer may include a first low pass filter 202 which receives and filters an input signal Vin. The first low pass filter 202 may correspond to a first order low pass filter having a single pole or a second order low pass filter having two poles, for example. In addition, an output of the first low pass filter 202 may be applied to a gain control circuit 204 of the equalizer, a group delay compensation circuit 206 and a second low pass filter 208 of the equalizer, as shown in FIG. 2A.

The gain control circuit 204 receives the output of the first low pass filter 202 and the input signal Vin. In addition, an output terminal of the gain control circuit 204 may be connected to an output terminal of the second low pass filter 208. The gain control circuit 204 may provide an output current thereof to the second low pass filter 208 and controls a gain in a transfer function of the equalizer.

The group delay compensation circuit 206 receives the output of the first low pass filter 202, and includes an output terminal that is connected to the output terminal of the gain control circuit 204. Therefore, the group delay compensation circuit 206 may be disposed substantially parallel or parallel to the gain control circuit 204, so as to reduce the amount of surface area taken up on a semiconductor substrate.

The second low pass filter 208 has an input terminal connected to an output terminal of the first low pass filter 202. The output terminal of the second low pass filter 208 may be connected to the output terminal of the gain control circuit 204 or to the output terminal of the group delay compensation circuit 206, for example. In addition, the second low pass filter 208 may be embodied as a first order low pass filter or a second order low pass filter, for example.

In an example, the equalizer may have some or all of the pass filter characteristics of the gain control circuit 204. Accordingly, signal distortion which may be due to the group delay may be substantially reduced and/or eliminated.

Figure 2B:
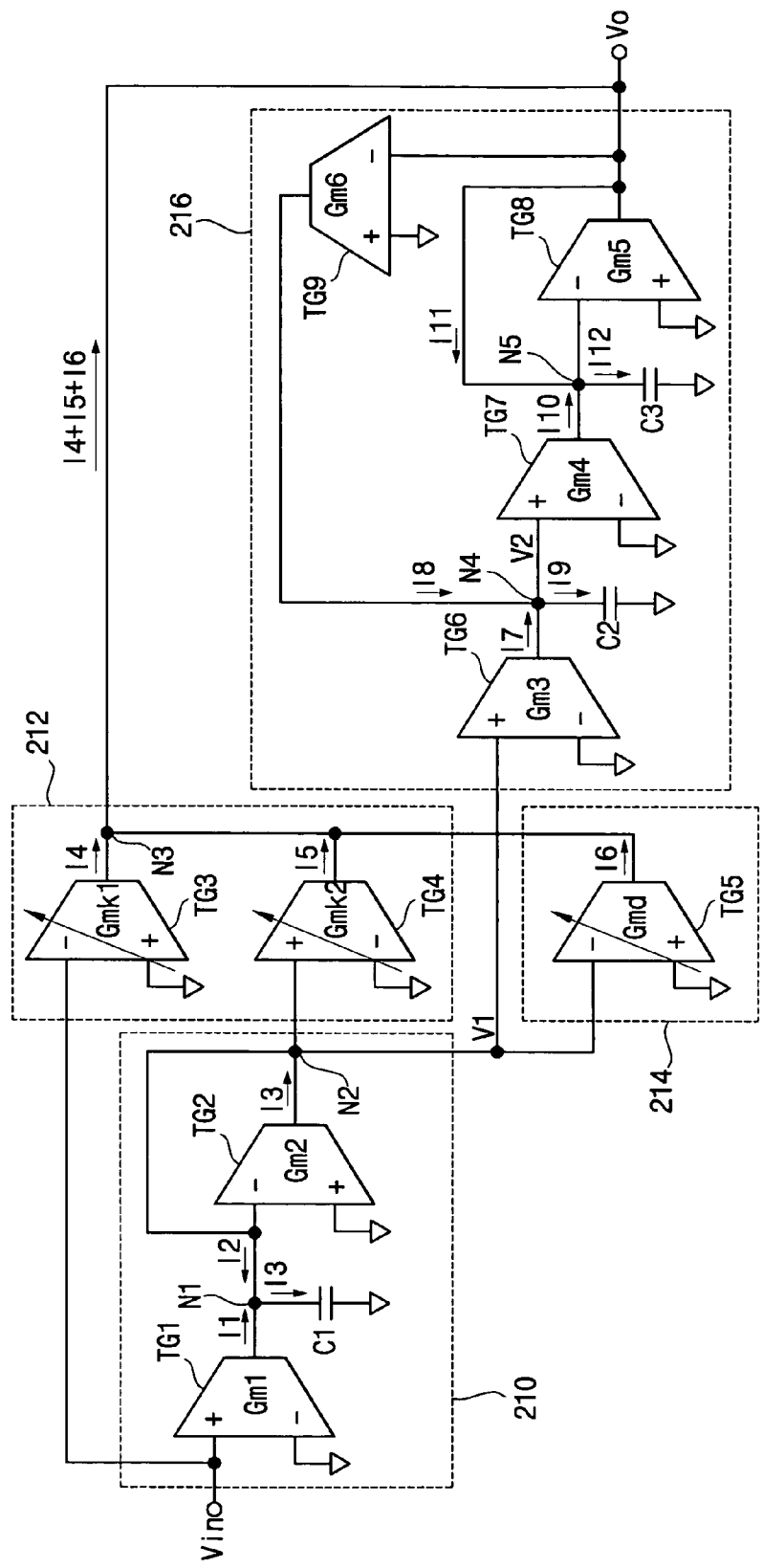
FIG. 2B is a circuit diagram illustrating the equalizer according to an exemplary embodiment of the present invention.

FIG. 2B is a circuit diagram illustrating an equalizer according to another exemplary embodiment of the present invention. Referring to FIG. 2B, the equalizer may include a first low pass filter 210, a gain control circuit 212, a group delay compensation circuit 214 and a second low pass filter 216.

The first low pass filter 210 may include two transconductors TG1 and TG2 and a capacitor C1. Therefore, the first low pass filter 210 in this example may have characteristics of a first order transfer function, i.e., the first low pass filter 210 represents an exemplary first order low pass filter. Alternatively, the first low pass filter 210 may be embodied as a second order low pass filter. In addition, the structure of the first order low pass filter 210 shown in FIG. 2B is merely exemplary, it is evident to those of ordinary skill in the art to utilize filter structures different from that shown in FIG. 2B.

Referring to FIG. 2B, the input signal Vin may be applied to a positive input terminal of the transconductor TG1, and a given bias voltage or given ground voltage may be applied to a negative input terminal thereof. For illustrative purposes only a ground voltage is applied to the negative input terminal in FIG. 2B. Hereinafter, the bias voltage or the ground voltage may be applied to either the positive input terminal or negative input terminal of the respective transconductors, which will be described below. The transconductor TG2 and the capacitor C1 may be connected to an output terminal of the transconductor TG1.

A negative input terminal and an output terminal of the transconductor TG2 may be connected together to the output terminal of the transconductor TG1. A positive input terminal of the transconductor TG2 may be connected to the ground. The capacitor C1 may be connected between a node N1 and ground, as shown in FIG. 2B.

The gain control circuit 212 may include two transconductors TG3 and TG4. The input signal Vin may be applied to a negative input terminal of transconductor TG3, the ground may be connected to a positive input terminal thereof, and an output terminal of transconductor TG3 may be connected to a node N3, as shown in FIG. 2B. A voltage at a node N2 may be applied to a positive input terminal of the transconductor TG4, the ground may be connected to a negative input terminal thereof, and an output terminal of the transconductor TG4 may be connected to the node N3, as shown in FIG. 2B.

The group delay compensation circuit 214 may be embodied by a transconductor TG5. A positive input terminal of the transconductor TG5 is connected to the ground, and the voltage at node N2 may be applied to a negative input terminal thereof. In addition, an output terminal of the transconductor TG5 is connected to the node N3 in the gain control circuit 212.

In an example, the group delay compensation circuit 214 may have a polarity that is opposite to the polarity of the gain control circuit 212. In other words, the voltage at node N2 is applied to the positive input terminal of the transconductor TG4 in the gain control circuit 212, and also applied to a negative input terminal of the transconductor TG5 in the group delay compensation circuit 214. In an example, the group delay compensation circuit 214 may be disposed substantially parallel or parallel to the gain control circuit 212, so as to reduce the amount of surface area taken up on a semiconductor substrate.

The second low pass filter 216 may include four transconductors TG6, TG7, TG8 and TG9 and two capacitors C2 and C3. Therefore, the second low pass filter 216 may have the characteristics of a second order low pass filter, for example. However, the second low pass filter 216 may alternatively have the characteristics of a first order low pass filter. In addition, it is evident to those having ordinary skill in the art that the transconductors TG6-TG9 may be connected to the capacitors C2 and C3 in a different manner than shown in FIG. 2B.

A positive input terminal of transconductor TG6 may be connected to an output terminal of transconductor TG2 in first low pass filter 210, and a negative input terminal thereof may be connected to ground. In addition, an output terminal of transconductor TG6 may be connected to a node N4 in second low pass filter 216.

A positive input terminal of transconductor TG7 may be connected to the output terminal of the second low pass filter 216 via the transconductor TG9, and also connected to node N4. The capacitor C2 is connected between the node N4 and ground. In addition, a negative input terminal of the transconductor TG7 may be connected to ground, and an output terminal thereof may be connected to a node N5 in the second low pass filter 216.

A negative input terminal of transconductor TG8 is connected to node N5, and a positive input terminal thereof is connected to ground. The capacitor C3 may be connected between the node N5 and ground, and an output terminal of transconductor TG8 may be connected to node N5, as shown in FIG. 2B.

A negative input terminal of transconductor TG9 may be connected to the output terminal of the transconductor TG8, which represents the output terminal of the second low pass filter 216. A positive input terminal of transconductor TG9 may be connected to ground, and an output terminal of the transconductor TG9 may be connected to node N4, as shown in FIG. 2B.

Characteristics of the First Low Pass Filter 210

Characteristics of the first low pass filter 210 are now described. Referring occasionally to FIG. 2B, and in case that Gm1 denotes a transconductance of the transconductor TG1, Gm2 represents transconductance of the transconductor TG2, and V1 denotes a voltage at node N1, a current I1 which may be drawn from an output terminal of the TG1 and delivered to the node N1 may be expressed by an equation of I1=Gm1×Vin. In addition, an output current I2 from transconductor TG2 may be expressed by an equation of I2=−Gm2×V1.

Since an input impedance of each transconductor (TG1 and TG2) approaches infinity, the output current I2 from transconductor TG2 may be delivered from the node N2 to the node N1. That is, current I2 is not delivered to input terminals of transconductors TG4 (in gain control circuit 212) and TG5 (in group delay compensation circuit 214). In addition, if I3 represents a current delivered to the ground through capacitor C1, the voltage at node N1 (V1) may be expressed in the s-domain (after taking the laplace transform) by the following equation (1) below.

$$V1 = \frac{Gm1}{Gm2+sC1} \quad Vin = \frac{Gm1/C1}{s+Gm2/C1} Vin \quad (1)$$

Characteristics of Gain Control Circuit 212, Group Delay Compensation Circuit 214

Characteristics of the gain control circuit 212 and group delay compensation circuit 214 are now described. In an example, Gmk1 denotes a transconductance of the transconductor TG3, Gmk2 represents a transconductance of the transconductor TG4, and Gmd denotes a transconductance of the transconductor TG5. In this example if Gmk1, Gmk2 and Gmd are variable, an output current I4 from transconductor TG3 may be expressed by the equation I4=−Gmk×Vin, an output current I5 from transconductor TG4 may be expressed by the equation I5=Gmk2×V1, and an output current I6 from transconductor TG5 may be expressed by the equation I6=−Gmd×V1.

Therefore, a current I4+I5+I6, which flows from node N3 to the output terminal of the second low pass filter 216, may be expressed by the following equation (2).

$$I4 + I5 + I6 = -Gmk1Vin + Gmk2V1 - GmdV1 \quad (2)$$
$$= -Gmk1Vin + (Gmk2 - Gmd)V1$$

By using the Vin from equation (1), the current I4+I5+I6 may further be expressed by the following equation (3).

$$I4 + I5 + I6 = -Gmk1Vin + \frac{Gm1(Gmk2 - Gmd)/C1}{s+Gm2/C1} Vin \quad (3)$$

Characteristics of Second Low Pass Filter 216

The characteristics of the second low pass filter 216 are now described. In an example where Gm3 denotes a transconductance of transconductor TG6, Gm6 denotes a transconductance of transconductor TG9, and V2 represents a voltage at node N4, a current I7 delivered from an output terminal of transconductor TG6 to node N4 is represented by the equation I7=Gm3×V1, and a current I8 delivered from an output terminal of the transconductor TG9 to node N4 is represented by the equation I8=−Gm6×Vo. A current I9 flowing from the node N4 to the ground is represented by I9=sC2×V2.

By Kirchoff's Current Law (KCL) at node N4, we get the following equations (4) and (5).

$$I7 = -I8 + I9 \quad (4)$$

$$Gm3V1 = Gm6Vo + sC2V2 \quad (5)$$

Substituting Vin in equation (1) for the Vin in equation (5), we get the following (6).

$$V2 = Gm3 \frac{Gm1/(C1C2)}{s(s+Gm2)/C1} Vin - \frac{Gm6/C2}{s} Vo \quad (6)$$

In case that Gm4 denotes a transconductance of transconductor TG7, and Gm8 represents a transconductance of transconductor TG8, a current I10 delivered from an output terminal of transconductor TG7 to node N5 may be expressed by the equation I10=Gm4×V2, and a current I12 flowing from node N5 to may be is expressed by an equation of I12=sC3×Vo. By KCL at the node N5 we get the following equation (7).

$$\frac{Vo}{Vin} = \frac{Gm1Gm3Gm4/(C1C2) - sGmk1(s+Gm2/C1) + sGm1(Gmk2-Gmd)/C1}{(s+Gm2/C1)[s(sC3+Gm5)+Gm4Gm6/C2]} \quad (7)$$

By rewriting the equation (7), the following equation (8) below may be obtained.

$$\frac{Vo}{Vin} = \left(\frac{Gm1/C1}{s+Gm2/C1}\right) \cdot \left(\frac{Gm3Gm4}{C2C3}\right) \cdot \left(\frac{-s^2 \frac{Gmk1C1C2}{Gm1Gm3Gm4} + s\frac{C2Gm1(Gmk2-Gmd)-C2Gmk1Gm2}{Gm1Gm3Gm4}}{s^2+sGm5/C3+Gm4Gm6/(C2C3)}\right) \quad (8)$$

In equation (8), a first order term of s is introduced into a numerator of the second order transfer function having biquad characteristics. Such a transfer function may have all pass filter characteristics, for example.

In addition, the gain of the transfer function may be dependent on a variable transconductance Gmk1, and a zero of the transfer function may be determined by the Gmk1, Gmk2 and Gmd transconductance terms.

For example, the transconductances Gm1, Gm2, Gm3 and Gm4 in an equalizer may have the same values, and the variable transconductances Gmk1 and Gmk2 may have same values. In this case, the transfer function of the equalizer may be given by the following equation (9).

$$\frac{Vo}{Vin} = \frac{Gm/C1}{s+Gm/C1} \frac{Gm2}{C2C3} \frac{1-s^32\frac{Gmk1C1C2}{GmGmGm}+s\frac{C2Gmd}{GmGm}}{s^2+sGm/C3+GmGm/(C2C3)} \quad (9)$$

Therefore, a gain of the transfer function may be dependent on the variable transconductance Gmk1, and a zero of the transfer function may be determined by the Gmd. Due to a first order term of s introduced in a numerator, the transfer function of the equalizer can have all pass filter characteristics. In addition, the effect of the first order term of s on the magnitude of the transfer function may be substantially reduced or minimized by modulating the Gmd.

Figure 3:
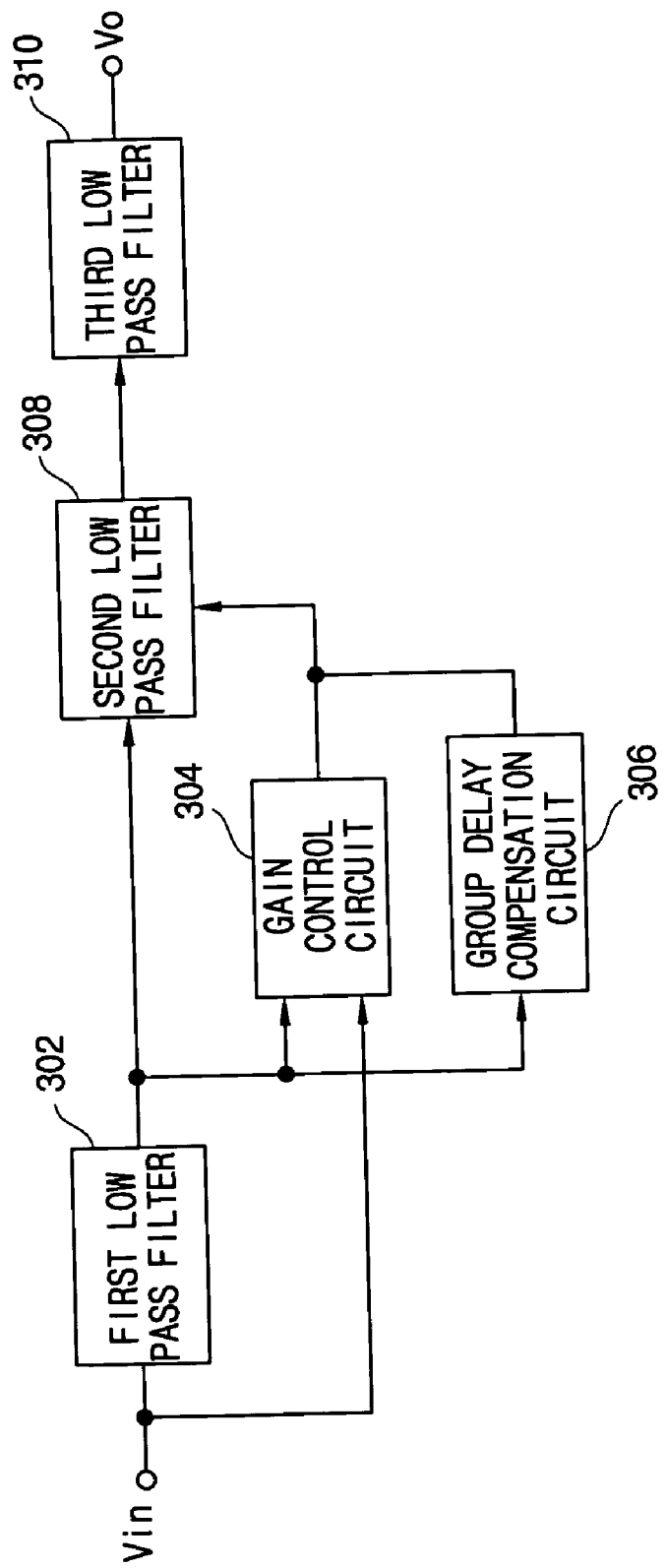
FIG. 3 is a block diagram illustrating an equalizer according to another exemplary embodiment of the present invention.

FIG. 3 is a block diagram illustrating an equalizer according to another exemplary embodiment of the present invention. Referring to FIG. 3, the equalizer is similar to that shown in FIG. 2A, but includes a third low pass filter 310. Referring to FIG. 3, a first low pass filter 302 of the equalizer receives and filters an input signal Vin. The first low pass filter 302 may be a first order low pass filter having a single pole or a second low pass filter having two poles, as previously described. An output of the first low pass filter 302 may be inputted to a gain control circuit 304, a group compensation circuit 306 and a second low pass filter 308 of the filter, as previously described.

The gain control circuit 304 may receive the output of the first low pass filter 302 and the output signal Vin. In addition, an output terminal of the gain control circuit 304 may be connected to an output terminal of the second low pass filter 308. The gain control circuit 304 may provide an output current to the second low pass filter 308, and may modulate a gain in a transfer function of the equalizer.

The group delay compensation circuit 306 receives the output of the first low pass filter 302, and an output terminal thereof may be connected to an output terminal of the gain control circuit 304. Therefore, the group delay compensation circuit 306 may be disposed substantially parallel or parallel to the gain control circuit 304, so as to reduce the amount of surface area taken up on a semiconductor substrate.

The second low pass filter 308 has an input terminal connected to an output terminal of the first low pass filter 308. An output terminal of the second low pass filter 308 may be connected to the output terminal of the gain control circuit 304 or to the output terminal of the group delay compensation circuit 306. In addition, the output terminal of the second low pass filter 308 is connected to an input terminal of the third low pass filter 310. The second low pass filter 308 may be a first order low pass filter or a second order low pass filter, for example, as previously described. The third low pass filter 310 receives an output of the second low pass filter 308. In addition, the third low pass filter 310 may also be embodied as a first order low pass filter or a second low pass filter, for example.

Components of FIG. 3 are substantially identical to those described in FIG. 2A except the third low pass filter 310, and thus, a detailed description of the same elements will be omitted for purposes of brevity. The third low pass filter 310 is connected to an output terminal of the second low pass filter 308. In addition, at least one low pass filter may be disposed in serial relation (serially) to the third low pass filter 310, thereby configuring an equalizer of a desired degree. In the example shown in FIG. 3, the third low pass filter 310 is in series with both the first and second low pass filters 302 and 308. The equalizer of FIG. 3 can have some or all the pass filter characteristics of the gain control circuit 304, such that signal distortion due to the group delay may be substantially reduced and/or minimized.

Having thus described exemplary embodiments of the present invention, it is to be understood that the exemplary embodiments of the present invention defined by the appended claims is not to be limited by particular details set forth in the above description, as many apparent variations thereof are possible without departing from the spirit or scope thereof as hereinafter claimed.

What is claimed is:

1. An equalizer circuit comprising:
a first low pass filter configured to filter a received input signal to output a filtered input signal;
a second low pass filter, connected to an output terminal of the first low pass filter, and configured to filter the filtered input signal;
a gain control circuit, connected to an output terminal of the first low pass filter, and configured to provide a current signal with the second low pass filter to modulate a gain of a transfer function for the equalizer circuit, the gain control circuit being configured to receive both the input signal and the filtered input signal, the current signal being based on the input signal and the filtered input signal; and
a group delay compensation circuit connected to the output terminal of the first low pass filter and to an output terminal of the gain control circuit, configured to compensate for a group delay of the input signal based on the filtered input signal.

2. The circuit of claim 1, wherein frequency characteristics of the second low pass filter are controlled by the gain control circuit and the group delay compensation circuit.

3. The circuit of claim 1, wherein the first low pass filter is embodied as one of a first order low pass filter having a single pole and a second order low pass filter having two poles.

4. The circuit claim 1, wherein the group delay compensation circuit includes a transconductor having a variable transconductance.

5. The circuit of claim 1, wherein the group delay compensation circuit is disposed substantially parallel to the gain control circuit.

6. The circuit of claim 1, wherein the group delay compensation circuit has an input terminal for receiving an output signal of the first low pass filter, and an output terminal connected to an output terminal of the gain control circuit.

7. The circuit of claim 1, wherein the second low pass filter is embodied as one of a first order low pass filter having a single pole and a second order low pass filter having two poles.

8. The circuit of claim 1, wherein an output terminal of the group delay compensation circuit is connected to an output terminal of the second low pass filter.

9. The circuit of claim 1, wherein an input terminal of the group delay compensation circuit has a polarity opposite to a polarity of an input terminal of the gain control circuit.

10. The circuit of claim 1, wherein the frequency characteristics of the equalizer circuit are all pass filter characteristics.

11. The circuit of claim 1, further comprising:
a third low pass filter connected to an output terminal of the second low pass filter.

12. The circuit of claim 11, wherein at least one low pass filter is connected to an output terminal of the third low pass filter and is in series with the third low pass filter.

13. An equalizer circuit comprising:
a group delay compensation circuit configured to compensate for a group delay of an input signal received thereto;
a gain control circuit configured to modulate a gain of a transfer function for the equalizer based on the input signal and a filtered output signal of a first low pass filter, the gain control circuit being configured to receive both the input signal and the filtered output signal; and
a second low pass filter connected to output terminals of the first low pass filter and the gain control circuit, the group delay compensation circuit being connected to the output terminal of the first low pass filter and to the output terminal of the gain control circuit, wherein the group delay compensation circuit is disposed substantially parallel to the gain control circuit in the equalizer.

14. The circuit of claim 13, the group delay compensation circuit being further embodied as a transconductor having a variable transconductance.

15. The circuit of claim 14, further comprising an input terminal for receiving the input signal from a first low pass filter of the equalizer, and an output terminal connected to an output terminal of the gain control circuit, the input terminal having a polarity opposite to a polarity of an input terminal of the gain control circuit.

16. The circuit of claim 14, wherein a second low pass filter of the equalizer is connected to an output of the group delay compensation circuit, and frequency characteristics of the second low pass filter are controlled by the gain control circuit and the group delay compensation circuit.

* * * * *